(12) United States Patent
Casagrande

(10) Patent No.: US 7,982,510 B2
(45) Date of Patent: Jul. 19, 2011

(54) SELF-CALIBRATION METHOD FOR A FREQUENCY SYNTHESIZER USING TWO POINT FSK MODULATION

(75) Inventor: Arnaud Casagrande, Bôle (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 12/573,253

(22) Filed: Oct. 5, 2009

(65) Prior Publication Data

US 2010/0090731 A1 Apr. 15, 2010

(30) Foreign Application Priority Data

Oct. 3, 2008 (EP) .................................... 08165830

(51) Int. Cl.
*H03L 7/06* (2006.01)
(52) U.S. Cl. ........................ 327/157; 327/148
(58) Field of Classification Search .................. 327/148, 327/157
See application file for complete search history.

(56) References Cited

U.S. PATENT DOCUMENTS

| | | | |
|---|---|---|---|
| 6,515,553 B1 | 2/2003 | Filiol et al. | |
| 7,330,058 B2 * | 2/2008 | Lin | 327/157 |
| 2003/0043950 A1 | 3/2003 | Hansen et al. | |
| 2003/0439450 | 3/2003 | Hansen et al. | |
| 2003/0203724 A1 | 10/2003 | Luo et al. | |
| 2005/0046488 A1 | 3/2005 | Grewing et al. | |
| 2006/0197605 A1 | 9/2006 | Hirano et al. | |

FOREIGN PATENT DOCUMENTS

EP 0 961 412 12/1999

OTHER PUBLICATIONS

European Search Report issued in corresponding application No. EP08165830 completed May 13, 2009.

* cited by examiner

Primary Examiner — Hai L Nguyen
(74) Attorney, Agent, or Firm — Griffin & Szipl, P.C.

(57) ABSTRACT

The frequency synthesizer for implementing a self-calibration method includes (i) a first phase lock loop comprising: a reference oscillator, a phase comparator, a first charge pump, a first loop filter, a voltage controlled oscillator, and a multi-mode divider counter controlled by a modulator and connected to the phase comparator; (ii) a high frequency access comprising a digital-analogue converter connected to an input of the voltage-controlled oscillator; (iii) a second charge pump connected to the phase comparator; and (iv) a second loop filter in the high frequency access. The second charge pump forms, when switched on, a second phase lock loop with the second loop filter. To calibrate gains of the converter, a voltage comparator compares an output voltage of the converter with a voltage stored in the second loop filter, after disconnecting the second charge pump from the second phase lock loop, previously locked onto a determined output frequency.

15 Claims, 9 Drawing Sheets

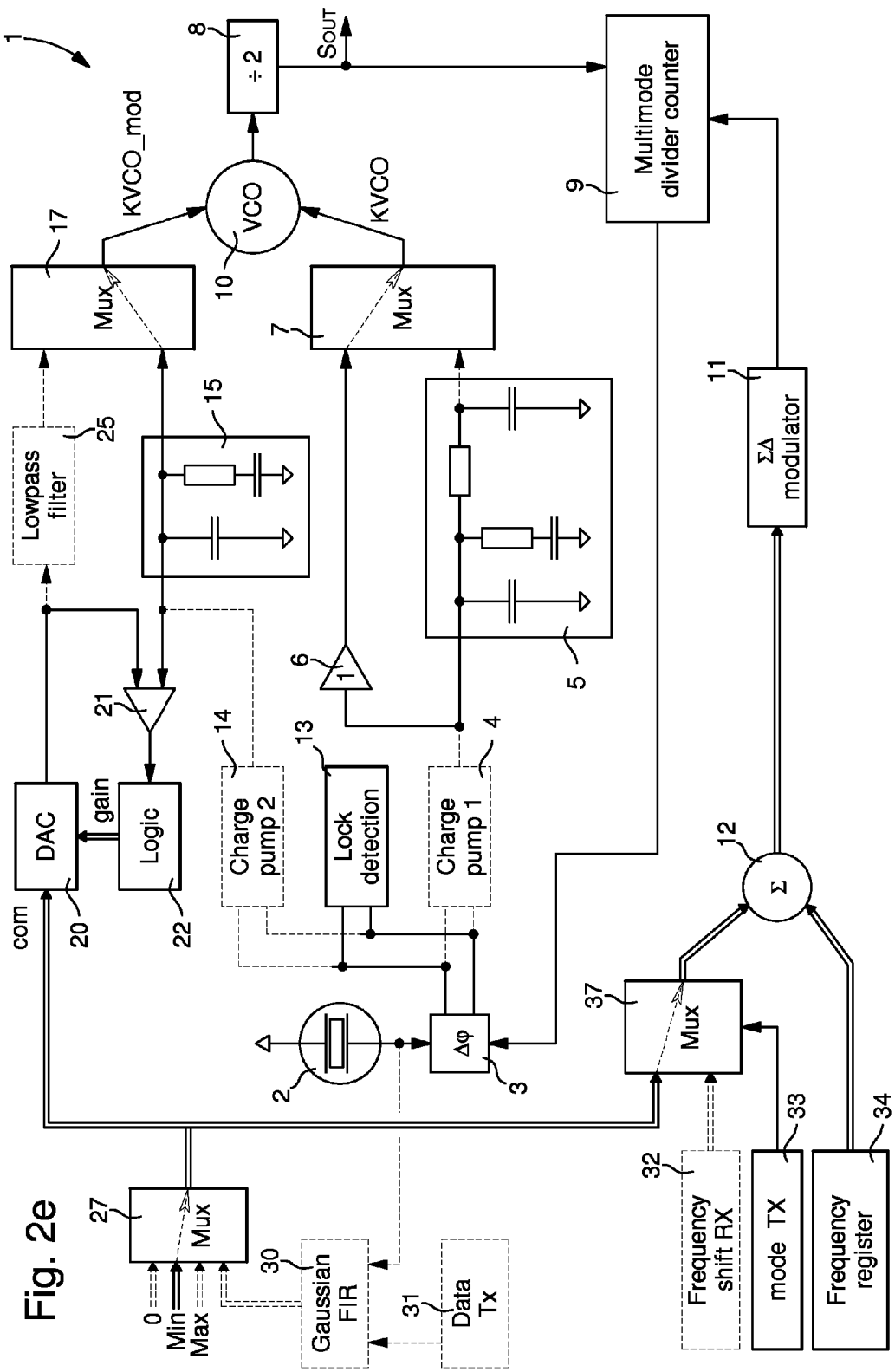

SELF-CALIBRATION METHOD FOR A FREQUENCY SYNTHESIZER USING TWO POINT FSK MODULATION

This application claims priority from European Patent Application No. 08165830.4 filed Oct. 3, 2008, the entire disclosure of which is incorporated herein by reference.

FIELD OF THE INVENTION

The invention concerns a self-calibration method for a frequency synthesizer using two point FSK modulation for transmitting data. The frequency synthesizer, in particular of low power type, includes a first low frequency phase lock loop in which is placed a voltage controlled oscillator, and a high frequency access, which includes a digital-analogue converter, connected to the voltage controlled oscillator. The first phase lock loop also includes a reference oscillator, a phase comparator, connected to the reference oscillator, a first low pass loop filter, and a multimode divider counter controlled by a modulator for supplying the phase comparator with a divided signal on the basis of a high frequency output signal from the synthesizer. The voltage-controlled oscillator is controlled at a first input by a first control voltage signal originating from the first loop filter, and at a second input by a second control voltage signal for modulating the high frequency data.

The invention also concerns a frequency synthesizer using two point FSK modulation for implementing the self-calibration method.

BACKGROUND OF THE INVENTION

Two-point frequency modulation is defined by adding the contribution of a high frequency path with a digital-analogue converter and a low frequency path in a low frequency phase lock loop at the voltage controlled oscillator. During high frequency state transitions, the high frequency path is of primary importance, whereas for low frequency state transitions, the low frequency path becomes of primary importance. However, both paths contribute to modulate data frequency to cover a determined bandwidth, which extends in high modulation frequency.

EP Patent No. 0 961 412 discloses a frequency synthesizer for two point frequency modulation for transmitting data. This frequency synthesizer uses a sigma delta type modulator for data modulation by controlling a variable divider in a low frequency phase lock loop, and a DAC digital-analogue converter for high frequency modulation. This DAC converter has a variable gain, which is regulated by a digital control unit, and is controlled by a digital control signal for data frequency modulation. This digital control signal is also transmitted to the sigma delta modulator to combine the low frequency modulation with that supplied by the DAC converter.

A relative delay variation is performed in the synthesizer on the modulation signal passing through the DAC converter relative to the modulation in the low frequency loop. However, this document discloses nothing concerning adaptation of the spectrum amplitude level of the data modulated by the low frequency phase lock loop and via the DAC converter. Consequently, undesired interference may arise depending upon the state transition frequency for data transmission.

US Patent Application No. 2003/0043950 also discloses a phase lock loop frequency synthesizer using two-point frequency modulation. This frequency synthesizer also includes a low frequency phase lock loop and a sigma delta modulator, a DAC digital-analogue converter whose output acts directly on the voltage controlled oscillator VCO. Data is modulated, on the one hand at a first input of the voltage controlled oscillator VCO via the multimode divider controlled by the modulator, and at a second input of the VCO oscillator by the DAC converter. Because of the two-point modulation, this frequency synthesizer prevents the attenuation of high frequency modulated data due to the narrow bandwidth of the phase lock loop.

Even if the DAC converter gain can be adjusted, there is no provision for equalising the spectrum amplitude level of the data modulated in the low frequency loop and in the digital-analogue converter. As for the preceding synthesizer, this may lead to some distortion problems for the data modulation during state transition.

In the US Patent Application No. 2005/0046488, it is described a compensating method for a frequency synthesizer using two point modulation. The frequency synthesizer includes in particular a first low-pass phase lock loop PLL, and a high frequency path for compensating the amplitude between an analogue modulation signal and a digital modulation signal to operate two point data modulation.

The first phase lock loop of this document includes a phase frequency detector, a first charge pump, a first low-pass loop filter and a voltage controlled oscillator VCO. The voltage controlled oscillator includes in input an adder, whose a first input is connected to the first low-pass filter, followed by a frequency generation unit. A fractional-N programmable divider closes the first loop between the voltage controlled oscillator and the phase frequency detector, which receives a reference signal from a reference oscillator. This divider is controlled by a digital modulation signal provided by a modulator.

The high frequency compensating path of this document includes also to form a second phase lock loop, a second charge pump and a second low-pass loop filter connected via a switch to a second input of the adder of the voltage controlled oscillator. The second charge pump and the second low-pass filter are with a same structure as the first charge pump and the first low-pass filter. This high frequency path includes still a comparison unit, which is a comparator, whose the output is connected to an analogue modulation unit, which receives an analogue modulation signal from a digital-analogue converter.

According to the compensating method of this document, a first digital modulation signal is supplied by the modulator in order to tune the first phase lock loop to a first frequency, which corresponds to the selected carrier frequency of a transmission channel subtracted by a digital modulation amplitude. In a second phase, a second digital modulation signal is supplied by the modulator in order to operate the second lock loop while maintaining a first voltage corresponding to the first frequency on the first filter of the first disconnected loop. With this second digital modulation signal, a second frequency is synthesized that corresponds to the selected carrier frequency added with a digital modulation amplitude. As an addition is carried out by the adder of the voltage controlled oscillator, the second voltage on the second filter represents a differential signal relative to the double of the analogue modulation amplitude. So this differential signal is compared with a voltage multiplied by two provided in output of the decoupling analogue modulation unit. The compared amplitude of the signals is equalised by the comparator, which acts on the analogue modulation unit in order to adapt the amplitude of the analogue modulation output signal.

One drawback of the frequency synthesizer using two point modulation of US Patent Application No. 2005/0046488 is that there is a same gain between the first loop and the second loop. This requires providing an important place for each low-pass loop filter with a same size on an integrated circuit made for such a synthesizer. Another drawback is that the voltage controlled oscillator includes an adder in input, which allows adding the contribution of the high frequency path with the low frequency path of the synthesizer. The first and second control voltages for the oscillator are not independent of each other, but directly added for that the addition result determines the output frequency of the oscillator. This does not allow adapt a different sensitivity of the two inputs of the voltage controlled oscillator. Another drawback is that it is not the digital-analogue converter, which is directly calibrated, but an analogue modulation unit, which complicates the arrangement with the converter into the synthesizer integrated circuit, with a more important electrical consumption, because the two units are always in function. A calibration has further to be carried out for each new selected carrier frequency, which is a drawback.

SUMMARY OF THE INVENTION

It is thus an object of the invention to provide a self-calibration method for a frequency synthesizer, which can easily equalise the spectrum amplitude level of the data modulated by the digital-analogue converter combined with the first low frequency phase lock loop, while overcoming the above-mentioned drawbacks of the prior art. This has to prevent distortion arising during high frequency state transitions of the data to be transmitted or state transition delays by the low frequency loop, while minimising the size of some electronic components in the high frequency access to make the synthesizer, and by reducing the general electrical consumption.

The above object is solved according to the present invention by the characteristics of a self-calibration method for a frequency synthesizer that can perform two point frequency modulation for data transmission, the frequency synthesizer including: —a first low frequency phase lock loop in which there are placed a reference oscillator, a phase comparator connected to the reference oscillator, a first low-pass loop filter, a voltage-controlled oscillator, which is connected via a first input of a first varactor with a first sensitivity in the first low frequency loop for receiving a first control voltage signal via the first low-pass filter, a multimode counter-divider controlled by a modulator to frequency divide a high frequency output signal on the basis of a high frequency signal produced by the voltage-controlled oscillator, so as to supply a divided signal for comparison with a reference signal of the reference oscillator in the phase comparator, and—a high frequency access in which is placed a digital-analogue converter for supplying a second control voltage signal to a second input of a second varactor with a second sensitivity of the voltage-controlled oscillator for high frequency data modulation, the second sensitivity being several orders of magnitude less than the first sensitivity, and the second varactor being independent of the first varactor, wherein the self-calibration method includes the steps of:

a) in a first phase, locking the first low-pass phase lock loop onto a transmission channel with a determined carrier frequency at the synthesizer output, and supplying a first command word to the converter in the high frequency access corresponding to the determined carrier frequency for generating a second control voltage signal for the voltage-controlled oscillator, at a first basic voltage level, b) in a second phase, opening the first phase lock loop, while maintaining, via the first loop filter, a first control voltage signal corresponding to the determined carrier frequency for the first input of the voltage-controlled oscillator, locking a second phase lock loop, which includes a second low-pass loop filter in the high frequency access connected between the phase comparator of the first loop and the second input of the voltage-controlled oscillator, at a first output frequency equal to the carrier frequency added to a maximum modulation frequency shift, and supplying the digital-analogue converter with a second command word that represents the first output frequency, c) in a third phase, opening the second phase lock loop while maintaining, via the second loop filter, a second control voltage signal corresponding to the first output frequency for the second input of the voltage-controlled oscillator, and comparing the converter output voltage with the voltage stored in the second loop filter to calibrate the converter gain automatically so that the converter output voltage is equivalent to the voltage stored in the second filter at a second voltage level, whose shift with the first basic voltage level defines the maximum equalised modulation frequency shift, and d) in a modulation phase, closing the first phase lock loop and connecting the converter output to the second input of the voltage-controlled oscillator for two point data modulation by the voltage-controlled oscillator using a series of command words in time supplied to the calibrated digital-analogue converter and to the modulator of the first phase lock loop.

Additionally, particular beneficial, embodiments of the present invention are provided in accordance with the following steps of the self-calibration method.

In accordance with a second embodiment of the present invention, the first embodiment is modified so that between step c) and step d), the self-calibration method includes the steps of: —in a fourth phase, closing and locking the second phase lock loop onto a second output frequency which is the result of subtracting the maximum modulation frequency deviation from the carrier frequency, and supplying a third command word to the digital-analogue converter to represent the second output frequency, and—in a fifth phase, opening the second phase lock loop while maintaining, via the second loop filter, a second control voltage signal corresponding to the second output frequency for the second input of the voltage-controlled oscillator, and comparing the converter output voltage to the voltage stored in the second loop filter, to calibrate the converter gain automatically so that the converter output voltage is equivalent to the voltage stored in the second filter at a third voltage level, whose shift with the first basic voltage level defines the maximum equalised modulation frequency shift. In accordance with a third embodiment of the present invention, the first embodiment is modified so that wherein the first phase lock loop includes a first charge pump between the phase comparator and the first loop filter, and the second phase lock loop includes a second charge pump between the phase comparator and the second loop filter, wherein the first phase lock loop is opened or closed via the first charge pump, wherein the second phase lock loop is opened or closed via the second charge pump, and wherein during an opening phase, the first charge pump and/or the second charge pump are gradually disconnected, particularly after 60 cycles, where the bandwidth of the first and/or second phase lock loops is gradually and continually reduced to 0 Hz, to maintain a constant voltage in the first filter and/or the second filter at a well defined level. In accordance with a fourth embodiment of the present invention, the first embodiment is modified so that in the first to fifth phases, the first control voltage signal is supplied by a unitary voltage follower connected at input to the first loop filter to compensate for the leakage current in the first varactor of the voltage-controlled oscillator. In accordance with a fifth embodiment of the present invention, the fourth embodiment is modified so that a first multiplexer is arranged between the first input of the voltage-controlled oscillator and the output of the first loop filter and the unitary voltage follower, wherein in the first to fifth phases, the first multiplexer is controlled to connect the voltage follower to the first input of the voltage-controlled oscillator, whereas in the modulation phase, the first multiplexer is controlled to connect the first low-pass filter to the first input of the voltage-controlled oscillator. In accordance with a sixth embodiment of the present invention, the first embodiment is modified so that a second multiplexer is arranged between the second input of the voltage-controlled oscillator and an output of the second loop filter and a low-pass anti-aliasing filter connected to the digital-analogue converter, wherein in the first phase and the modulation phase, the second multiplexer is controlled to connect the second input of the voltage-controlled oscillator to the anti-aliasing filter for direct supplying the second control voltage signal originating from the digital-analogue converter output, and wherein in the second to fifth phases, the second multiplexer is controlled to connect the second input of the voltage-controlled oscillator to the second loop filter to receive a third control voltage signal. In accordance with a seventh embodiment of the present invention, the first embodiment is modified so that the digital-analogue converter calibration steps are performed as soon as the synthesizer is switched on or in a synthesizer operating mode at the end of each programmed operating period, and wherein a control logic, connected at output to a comparator, adapts the converter gain by a binary word, such as a 5-bit word.

One advantage of the self-calibration method according to the invention, generally, lies in the fact that the digital-analogue converter can be automatically calibrated by adjusting the gain thereof by comparing the voltage across a second loop filter in the high frequency access of a second phase lock loop in operation, to the output voltage of said converter. This converter gain is adjusted after a first lock phase of the first phase lock loop has been performed on a determined carrier frequency transmission channel, and a first command word has been supplied to the converter input to correspond to said carrier frequency.

After a second lock phase at a first high output modulation frequency by a second loop, the second loop is disconnected in a third phase. This maintains an approximately constant calibration voltage, without any fluctuations in the second loop filter. Thus, the voltage comparison in the high frequency access is advantageously performed in this third phase on the basis of a second command word normally supplied to the converter in a second phase corresponding to the first high output modulation frequency. The voltage offset or shift at the converter output is thus calibrated by means of the constant calibration voltage across the second filter, for identical modulation frequency deviation between the first phase lock loop and the high frequency access.

Advantageously, a fourth phase, in which the second phase lock loop is closed and locked at a second low output modulation frequency, is followed by a fifth phase of the self-calibration method, in which the second loop is disconnected to store a low calibration voltage across the second filter. This allows the digital-analogue converter to be calibrated on the basis of a comparison of the voltage stored across the second loop filter. To do this, a third command word is supplied to the converter so as to compare the output voltage of said converter to the voltage across the second loop filter to adjust the converter gain again. Frequency modulation for data transmission can advantageously be performed by switching between the first output frequency and the second output frequency around the carrier frequency.

Advantageously the second phase lock loop includes a second filter with a small size in relation to the first filter of the first phase lock loop. This second small size filter allows provide a second control voltage to a second input of the voltage controlled oscillator, which has a second sensitivity with several orders of magnitude lower than the first sensitivity of the first input of the oscillator, for example of the order of 100 times lower. So the whole calibrating operation of the digital-analogue converter is carried out with a minimum number of electronic components, which take a relatively limited place in relation to the components linked to the first phase lock loop.

Advantageously the first and/or second phase lock loops may have a differential structure, in particular the charge pump and the loop filter. Owing to the differential structure some errors are avoided in the voltage stored across the first and/or second loop filters during gradual disconnection of the first and/or second charge pumps.

It is also an object of the invention to provide a frequency synthesizer using two-point frequency modulation, which includes means for equalising the spectrum amplitude level of the data modulated by the digital-analogue converter combined with the first phase lock loop.

The above object is solved by the characteristics of an eighth embodiment of a frequency synthesizer, for implementing the self-calibration method according to the first embodiment of the present invention, the frequency synthesizer being able to perform two point frequency modulation for data transmission, wherein the frequency synthesizer includes:

a first low frequency phase lock loop in which there are placed a reference oscillator, a phase comparator connected to the reference oscillator, a first low-pass loop filter connected to the phase comparator via a first charge pump, a voltage-controlled oscillator, which is connected via a first input of a first varactor with a first sensitivity in the first low frequency loop for receiving a first control voltage signal via the first low-pass filter, a multimode counter-divider controlled by a modulator to frequency divide a high frequency output signal on the basis of a high frequency signal produced by the voltage-controlled oscillator, so as to supply a divided signal for comparison with a reference signal of the reference oscillator in the phase comparator, and a high frequency access in which is placed a digital-analogue converter for supplying a second control voltage signal to a second input of a second varactor with a second sensitivity of the voltage-controlled oscillator for high frequency data modulation, the second sensitivity being several orders of magnitude less than the first sensitivity, and the second varactor being independent of the first varactor, wherein the frequency synthesizer being includes a second loop filter in the high frequency access that can be connected via a second charge pump between the phase comparator of the first loop and the second input of the voltage-controlled oscillator so as to form a second low frequency phase lock loop for a digital-analogue converter calibration operation, and in that the high frequency access includes a voltage comparator for comparing an output voltage, which comes directly from the digital-analogue converter, to a voltage stored in the second loop filter, after locking the second phase lock loop onto a determined output frequency, so as to automatically adjust the digital-analogue converter gain.

Additionally, particularly beneficial embodiments of the present invention are provided in accordance with the following frequency synthesizer embodiments.

In accordance with a ninth embodiment of the present invention, the eighth embodiment is modified so that the frequency synthesizer includes a control logic in the high frequency access for receiving an output signal from the voltage comparator so as to supply a binary word for adjusting the digital-analogue converter gain, where the binary word can be a 5-bit word. In accordance with a tenth embodiment of the present invention, the eighth embodiment is modified so that the frequency synthesizer includes a unitary voltage follower in the first phase lock loop, one input of which is connected to one input of the first loop filter, and one output of the voltage follower can be connected to a first input of the voltage-controlled oscillator, said unitary voltage follower being provided to compensate for any current leakage in the voltage-controlled oscillator varactor. In accordance with a eleventh embodiment of the present invention, the tenth embodiment is modified so that the frequency synthesizer includes a first multiplexer arranged between the first input of the voltage-controlled oscillator and the output of the first loop filter and the unitary voltage follower, the first multiplexer being controlled to connect the voltage follower or the first loop filter to the first input of the voltage-controlled oscillator. In accordance with a twelfth embodiment of the present invention, the eighth embodiment is modified so that the frequency synthesizer includes a second multiplexer arranged between the second input of the voltage-controlled oscillator, the second sensitivity of which is of the order of 100 times less than the first sensitivity of the first input, in particular around 4 MHz/V, and one output of the second loop filter and a low-pass anti-aliasing filter connected to the digital-analogue converter, the second multiplexer being controlled to connect the anti-aliasing filter or the second loop filter to the second input of the voltage-controlled oscillator. In accordance with a thirteenth embodiment of the present invention, the eighth embodiment is modified so that the first phase lock loop includes a differential structure formed of a first differential charge pump, a first differential loop filter and a differential voltage follower for connecting either the output of the differential voltage follower, or the output of the first loop filter to the first differential input of the voltage-controlled oscillator. In accordance with a fourteenth embodiment of the present invention, the eighth embodiment is modified so that the second phase lock loop includes a differential structure formed of a second differential charge pump and a second differential loop filter, wherein the output of the second loop filter is for connection to the second differential input of the voltage-controlled oscillator when the second phase lock loop is closed. In accordance with a fifteenth embodiment of the present invention, the eighth embodiment is modified so that the frequency synthesizer includes a modulation multiplexer for supplying at least one modulation frequency command word to the digital-analogue converter and to a sigma delta modulator for controlling the multimode counter-divider of the first or second phase lock loop, and wherein the digital-analogue converter is formed of switched current sources and an active poly-resistant load OTA.

BRIEF DESCRIPTION OF THE DRAWINGS

The objects, advantages and features of the self-calibration method for a frequency synthesizer using two point frequency modulation, and the frequency synthesizer for implementing said method will appear more clearly in the following description on the basis of at least one non-limiting embodiment illustrated by the drawings, in which:

FIGS. 2a to 2f show the various steps of the self-calibration method, clearly showing the various elements in operation of the frequency synthesizer using two point frequency modulation of FIG. 1 for each step of the method according to the invention.

DETAILED DESCRIPTION OF THE INVENTION

In the following description, all of the components of the frequency synthesizer using two point (FSK) frequency modulation, which are well known to those skilled in the art in this technical field, will be described only in a simplified manner. All of the frequency synthesizer elements that contribute to implementing the self-calibration method for equalising the spectrum amplitude level of data modulated by the frequency synthesizer are specifically specified.

Figure 1:
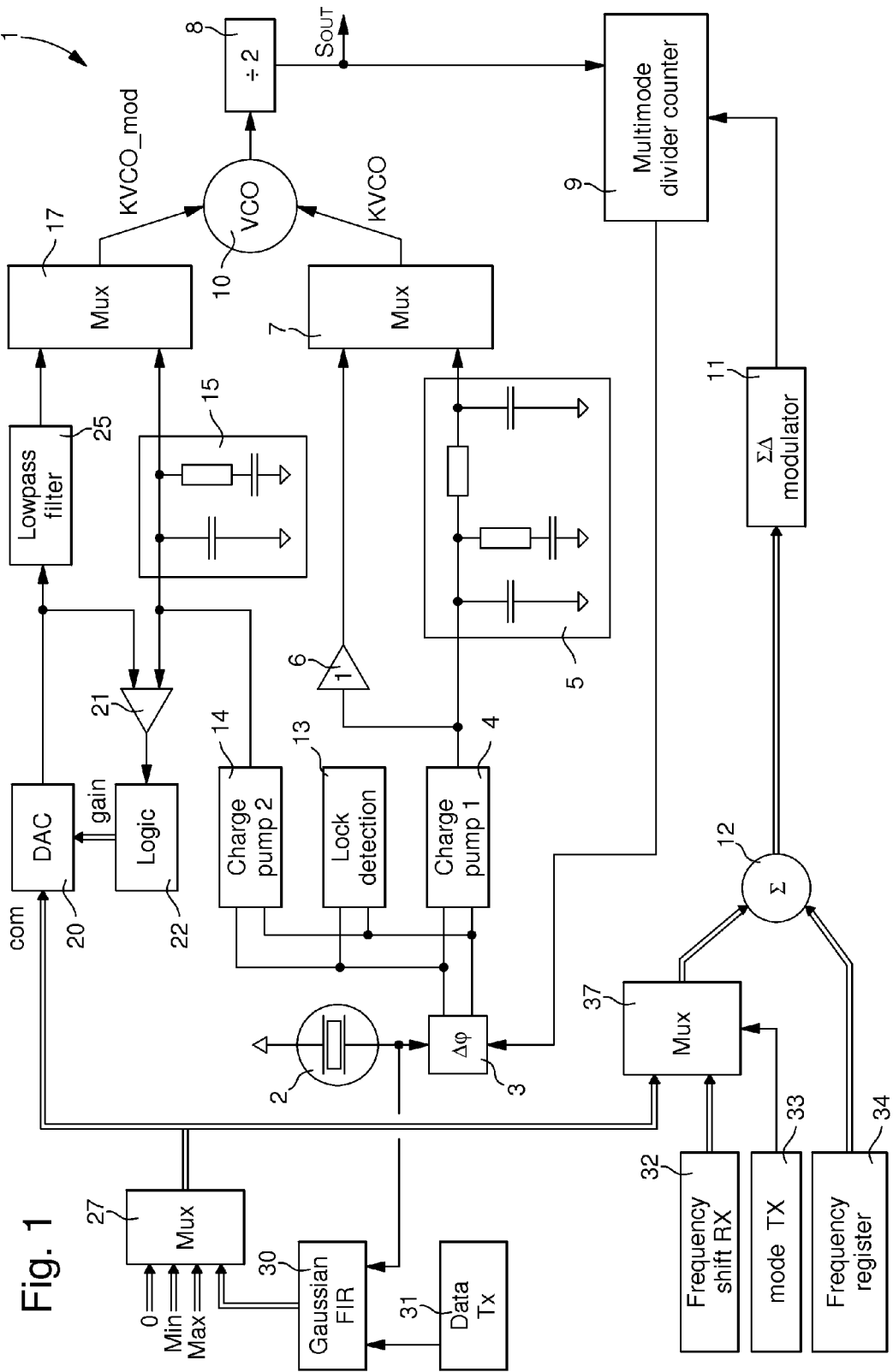
FIG. 1 shows, in a simplified manner, one embodiment of the frequency synthesizer for two-point frequency modulation according to the invention.

FIG. 1 shows a preferred embodiment of a frequency synthesizer 1 using two-point frequency modulation. This frequency synthesizer may be used in particular for transmitting frequency-modulated data in a radio-frequency signal. The frequency synthesizer may form an important part of a GFSK transmitter working in a frequency band close to 2.45 GHz. This frequency synthesizer may be made in 0.18 μm CMOS technology for example.

Frequency synthesizer 1 mainly includes a first low frequency or low-pass phase lock loop, and a high frequency access connected to a voltage-controlled oscillator VCO 10 of the first phase lock loop. The high frequency access includes a digital-analogue converter 20 and means for automatically calibrating the converter gain as explained below. Frequency precision is obtained via the first low frequency phase lock loop, and switching rapidity is obtained by the high frequency access. For high frequency state transitions during data modulation, the high frequency access is thus mainly used, whereas for low frequency state transitions, the more precise first phase lock loop is used.

The first low frequency phase lock loop includes first of all a reference oscillator 2, which may preferably be a quartz oscillator, for supplying a reference signal, having a frequency located between 16 and 26 MHz, to a phase comparator 3. A first low-pass loop filter 5 is connected to the phase comparator by a first charge pump 4, which forms part of connecting means. Two wires connect the phase comparator 3 to the first charge pump to supply a well-known high and low digital signal to first pump charge 4. The polarising current of this typical charge pump may be around 3 μA.

The VCO voltage-controlled oscillator 10 may comprise two parallel dedicated varactors, which are independent of each other. The first oscillator varactor has a first high sensitivity input and the second oscillator varactor has a second low sensitivity input. The oscillator output frequency f(V) is the result of the addition of frequency f1(V1) generated by the first varactor and frequency f2(V2) generated by the second varactor. A capacitive summation is performed by these two varactors, and not a conventional input voltage summation.

This voltage-controlled oscillator is thus connected by a first high sensitivity input of the first varactor, for example of the order of magnitude of 400 MHz/V in the first phase lock loop. The first input of the voltage-controlled oscillator can receive a first control voltage signal KVCO via the first loop filter 5. This loop filter may be a second order low-pass filter as shown by the arrangement of three capacitors (e.g. 20 pF, 200 pF, 10 pF) and two resistors (e.g. 100 kOhm, 16 kOhm) of low-pass filter unit 5. The cut off frequency of the first loop filter may be selected to be 100 kHz depending upon the frequency of reference oscillator 2.

Voltage controlled oscillator 10 is capable of generating a high frequency signal whose frequency may be close to 5 GHz. However, the transmission of modulated data from transmitter GFSK is carried out on a carrier frequency of a transmission channel close to 2.45 GHz. Consequently, voltage controlled oscillator 10 is followed in the first phase lock loop by a divider-by-two 8 in order to supply a high frequency output signal $S_{OUT}$ that includes modulated data for transmission.

High frequency output signal $S_{OUT}$ is divided by a multimode divider counter 9 controlled by a modulator, such as a well-known sigma delta modulator 11. This sigma delta modulator can be made on the basis of a basic third order 1-1-1 MASH structure. The multimode divider counter 9 supplies a signal divided by a fractional-N factor to phase comparator 3 of the first phase lock loop for comparison to the reference signal of reference oscillator 2.

In order to implement the self-calibration method, the first phase lock loop also includes in parallel to the first loop filter 5, a unitary voltage follower 6, whose input is connected between the output of the first charge pump 4 and the first loop filter 5. A first multiplexer 7 receives a voltage signal from unitary voltage follower 6 at a first input and a voltage signal from the first loop filter 5 at a second input. The output of the first multiplexer is directly connected to the first input of voltage controlled oscillator 10 for supplying the first control voltage signal KVCO. The first control voltage signal KVCO comes either directly from the first loop filter 5, or directly from the voltage follower depending upon the state of a control signal supplied to the first multiplexer that is not shown.

As will be explained below, the unitary voltage follower 6 is used in the self-calibration method in particular when the first charge pump is switched off. In this case, the varactor of voltage controlled oscillator 10 loses some current, which is compensated by the voltage follower, so that the voltage across the first loop filter 5 remains constant to supply the first control voltage signal KVCO. However, once the calibrating operation has finished, unitary voltage follower 6 has to be disconnected for data modulation.

The voltage follower has to be disconnected for reasons of stability, since the bandwidth of the follower must be at least 10 times the cut-off frequency of the first loop filter, which is of the order of 100 kHz. Moreover, the noise generated by unitary voltage follower 6 is converted into phase noise, which may be a problem with the broad gain in voltage controlled oscillator 10 linked to the first control voltage signal KVCO.

The first phase lock loop may include a differential structure (not shown) between first charge pump 4 and voltage controlled oscillator 10. This structure may be formed of a first differential charge pump 4, a first differential loop filter 5 and a unitary gain differential voltage follower 6. The first multiplexer 7 can thus connect the differential voltage follower output, or the first loop filter output to the first differential input of the voltage-controlled oscillator. In this differential structure, the capacitive value of the first differential loop filter is advantageously half the capacitive value of a first asymmetrical loop filter, which reduces its surface area during integration.

Owing to the differential structure from the first differential charge pump 4, the first low frequency phase lock loop is thus insulated from any interference that may occur. This interference may thus be cancelled out, which may be important because of the high sensitivity (400 MHz/V) at the first input of voltage-controlled oscillator 10. Thus, the carrier frequency of the selected transmission channel is generated precisely via the first phase lock loop.

The high frequency access of frequency synthesiser 1 for two point frequency modulation thus includes the digital-analogue converter. This digital-analogue converter 20 could be implemented with switched current sources and an active poly-resistance load OTA. The current sources may for example be cancelled out in the case of a received command word com like 0 in a first phase of the self-calibration method. If this word is defined as 0, this enables the converter to be uninfluenced by an alteration in the converter gain. This may be advantageous for calibrating operations for said converter, which are described below with reference to FIGS. 2a to 2f.

The output voltage signal of the digital-analogue converter is filtered in a low-pass filter 25, which is anti-aliasing filter that can remove image frequencies in the modulated data spectrum around n times the converter clock frequency. This clock frequency may, for example, be identical to the reference signal frequency. The low-pass filter 25 may be formed by a simple first order RC structure, since a first filtering operation has already been performed in digital-analogue converter 20.

The signal filtered by low-pass filter 25 can be supplied as second control voltage signal KVCO_mod to a second input of the second varactor of voltage-controlled oscillator 10, independent of the first varactor. The voltage sensitivity at the second input of the voltage-controlled oscillator, independent of the first input, may be of the order of 4 MHz/V, which is 100 times less than the sensitivity of the first input mentioned above. This allows the digital-analogue converter 20 to work with larger amplitude, while having smaller spurs due to the converter clock injection.

In order to produce a flat voltage with the frequency deviation characteristic, the modulation varactor of voltage-controlled oscillator 10 must be polarized around its maximum working gain. The maximum deviation of +500 kHz at 4.9 GHz leads to a sufficiently linear approximation of the voltage with the frequency characteristic of voltage controlled oscillator 10 for sensitivity within the 4 MHz/V margin. In this case, the maximum positive voltage deviation necessary to generate +500 kHz of frequency deviation is within the 125 mV margin for the second control voltage signal KVCO_mod.

It should be noted that the fact of using a second varactor of the voltage-controlled oscillator, which has much less sensitivity than that of the first varactor of the first phase lock loop, maximises the necessary voltage or frequency shift to be achieved. This consequently also minimises the offset influence of comparator 21, which may be of the order of a mV, and the noise of digital-analogue converter 20. This offset may even be removed with double calibration of the digital-analogue converter with a maximum modulation frequency shift ($\Delta f$) in a third phase, and with a minimum modulation frequency shift ($-\Delta f$) in a fifth calibrating phase.

In order to be able to calibrate automatically the gain of digital-analogue converter 20, the high frequency access also includes calibrating means, which are switched on during the converter self-calibration operation. The calibrating means are formed by a second charge pump 14 connected to phase comparator 3, a second low-pass loop filter 15, a voltage comparator 21 for comparing the voltage across the second loop filter 15 with the output voltage of converter 20, and a control logic 22 at the comparator output for adapting the converter gain. The typical polarising current of the second charge pump 14 may be in the region of 40 µA.

The second loop filter 15 may be formed by a first capacitor (e.g. 1 pF) in parallel with a resistor (e.g. 400 kOhm) and a second capacitor (e.g. 20 pF). This second loop filter is with a size lower than the size of the first loop filter, given that this second filter is a part of the second phase lock loop in order to provide a control voltage at a second input of the voltage controlled oscillator with a sensitivity lower than the sensitivity of the first input. The cut-off frequency of this second filter may be of the order of 77 kHz. For the voltage comparator, its offset should be low, for example lower than 1 mV so as to have a small error added to the corresponding frequency deviation. Moreover, it should have a slew rate that is high enough not to slow down the calibration phase of the digital-analogue converter logic. An offset compensated switched capacitor topology could be used.

The second phase lock loop may also include a differential structure (not shown) between the second charge pump 14 and voltage-controlled oscillator 10. This structure may be formed of a second differential charge pump and a second differential loop filter 15. The second multiplexer 17 can thus connect the output of the second loop filter to the second differential input of the voltage-controlled oscillator when the second loop is locked. Owing to the differential structure, this prevents voltage errors in the second loop filter during gradual disconnection of a conventional second charge pump, since the cut off of PMOS transistors may be slower or quicker than the cut off of NMOS transistors. In this differential structure, the capacitive value of the second differential loop filter is advantageously half the capacitive value of a second asymmetrical loop filter, which reduces the surface area thereof during integration.

With this differential structure of the second charge pump and the second loop filter, and so as to keep a comparator 21, a control logic 22 and a digital-analogue converter 20 of asymmetrical structure, it may be advantageous to arrange a conversion device between the second loop filter and the input of comparator 21. This conversion device (not shown) converts the differential voltage across the second filter into an absolute voltage to be compared to the digital-analogue converter output voltage. This conversion device may be made in a conventional manner via an amplifier, and four resistors of identical value connected to the amplifier inputs and output. Two voltage followers may also be provided between the second differential loop filter and the resistors connected to the amplifier inputs.

Control logic 22 could supply a gain defined over 5 bits. This would allow all possible gains between 250 kHz and 750 kHz maximum deviation, which would lead to 8 kHz of maximum deviation error while ensuring that the second control voltage signal KVCO_mod is linear. The decision algorithm could be based on the Newton method.

For the converter self-calibration, the second loop filter 15 is connected to the second input of voltage-controlled oscillator 10 via a second multiplexer 17. In such case, no voltage signal is transmitted across lowpass filter 25 connected to another input of second multiplexer 17 is transmitted as second control voltage signal KVCO_mod to the second input of voltage controlled oscillator 10. During the self-calibration operation, a second lowpass phase lock loop is achieved with the second charge pump 14 switched on, connected to phase comparator 3 by two wires and the second loop filter 15 connected to the second input of the voltage controlled oscillator. This second phase lock loop is made in order to have a different dynamic of the first phase lock loop.

The second charge pump 14 is thus a part of connecting means just like first charge pump 4. Either one of the charge pumps may be switched on when the other is switched off to close or open one phase lock loop or the other as explained below with reference to FIGS. 2a to 2f.

A lock detector 13 may also be provided, connected to the two input wires of the two charge pumps 4, 14 so as to detect the moment when one of the two switched-on phase lock loops is locked to a programmed frequency. However, it is not very often useful to use this type of lock detector for several reasons, particularly in said self-calibration method. The lock detector may not be used, since it has a reaction time, which may not be desired during switching from one phase to another in the self-calibration method. It is only useful during a big change of transmission channel where a large frequency shift is noted. Once the first phase lock loop has locked on, the phase shift is very small which may also be difficult to detect. Moreover, the lock time of this type of phase lock loop is generally known, particularly for passing from one transmission channel to another close channel. Consequently, it may be preferable to fix the (determinist) switching times from one calibration phase to the other.

By locking the second phase lock loop onto a frequency that corresponds, for example, to the selected carrier frequency added to or subtracted from a desired maximum modulation frequency deviation or shift, it is possible to calibrate the digital-analogue converter in a subsequent phase. In order to do this, after the second phase lock loop has locked onto one modulation output frequency or another, the second loop is gradually disconnected to maintain an approximately constant stored voltage across second loop filter 15. This voltage across the second filter is then compared to the output voltage of converter 20 by voltage comparator 21. The converter output voltage depends on a command word com supplied to the converter input to represent, for example, one or other desired modulation output frequency. The converter gain can thus be adapted by control logic 22, which follows the comparator so as to make the converter output voltage equal to the voltage stored across the second loop filter. This gain is adapted relative to a basic converter output voltage as a function of a command word that represents, for example, the desired carrier frequency at the synthesiser output.

During programming of a frequency to be synthesized for the self-calibration method, sigma-delta modulator 11 receives the same command word as digital-analogue converter 20. In order to do this, a third multiplexer 37 receives at input either the command word com, or a frequency shift 32 in the reception mode of the transmitter GFSK. This frequency shift makes it possible to adapt the frequency to be synthesized as a function of the frequency of the radio-frequency signals received by the transmitter.

Thus, in the modulation mode controlled by the mode Tx 33, this third multiplexer 37 transmits the command word com to an adder 12. The adder carries out the addition of a word relating to the frequency of a desired transmission channel originating from a frequency register 34, and command word com.

Each binary command word com for digital-analogue converter 20 or sigma-delta modulator 11 is preferably a 4-bit word. Each binary command word is supplied through a multiplexer 27, defined as a modulation multiplexer. Normally, the 4 bits of the binary command word for the converter calibration operation are defined as being between −8 and +7, but in order to be symmetrical relative to 0, they are chosen only from −7 to +7. In this case, the binary word 0, which represents the carrier frequency selected for the transmission channel, is 1000. The binary word Max, for representing the maximum modulation frequency deviation to be added to the carrier frequency, is the binary word 1111. Finally, the binary word Min, for representing the maximum modulation frequency to be subtracted from the carrier frequency, is the binary word 0001. This configuration is defined as N-signed.

When modulation multiplexer 27 is controlled by a 2-bit signal to supply the binary word 0 to digital-analogue converter 20, the basic converter output voltage is not influenced by an alteration to the converter gain. However, when modulation multiplexer 27 is commanded to supply either binary word Max, or binary word Min for the converter calibration operation, the calibrated converter gain has a direct influence on the output voltage level of the digital-analogue converter. By a voltage comparison in voltage comparator 21, this allows the converter output voltage deviation to be adjusted between the output voltage representing the carrier frequency and the output voltage representing one of the modulation output frequencies. In this manner, as explained below with reference to FIGS. 2a to 2f, it is possible to equalise the frequency deviation in the first phase lock loop and in the high frequency access to avoid distortions in state transitions during data modulation.

When the digital-analogue converter gain is automatically calibrated, it is possible to place the synthesizer in a data modulation mode. In order to do this, modulation multiplexer 27 is controlled so as to be connected to a Gaussian type digital filter 30 clocked by a clock signal provided by the reference signal from reference oscillator 2. The Gaussian type filter shapes a data signal Tx 31 so as to provide a series of binary command words that can change state over time at a frequency of up to 2 MHz for example as a function of the data to be transmitted. Consequently, the digital-analogue converter must be fast enough to follow the maximum rate of modulation bit-stream of at least 1 Mbit/sec, and which may be up to a maximum of 2 Mbit/sec.

It should be noted that the value of high frequency signal frequency generated by voltage controlled oscillator 10 is double the frequency of high frequency output signal $S_{OUT}$, which includes the frequency modulated data, at the output of a divider-by-two 8. Consequently, double the maximum modulation frequency deviation or shift Δf and carrier frequency $f_0$ must be provided in order to obtain the desired frequency in high frequency output signal $S_{OUT}$. The carrier frequency of a selected transmission channel, in output signal $S_{OUT}$ may have a value close to 2.45 GHz with frequency-modulated data, around this carrier frequency, at a frequency of at least 1 MHz.

When the modulation frequency deviation by the high frequency access is not identical to the modulation frequency deviation by the first phase lock loop prior to the calibration operation, this leads to some distortions or switching delays on the output signal of the frequency synthesizer. In order to obtain an almost constant frequency deviation during modulation over the entire frequency range of the synthesizer modulation bandwidth, the digital-analogue converter has to be calibrated.

Figure 3A:
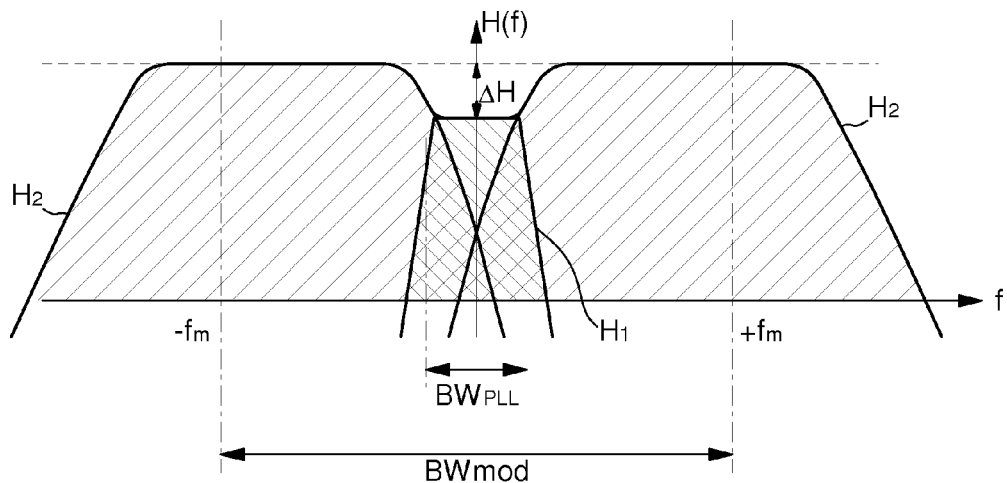
FIGS. 3a and 3b show graphs of the transfer or spectrum functions of the data modulated by the first low frequency phase lock loop and by the high frequency access of the two point frequency synthesizer.
Figure 3B:
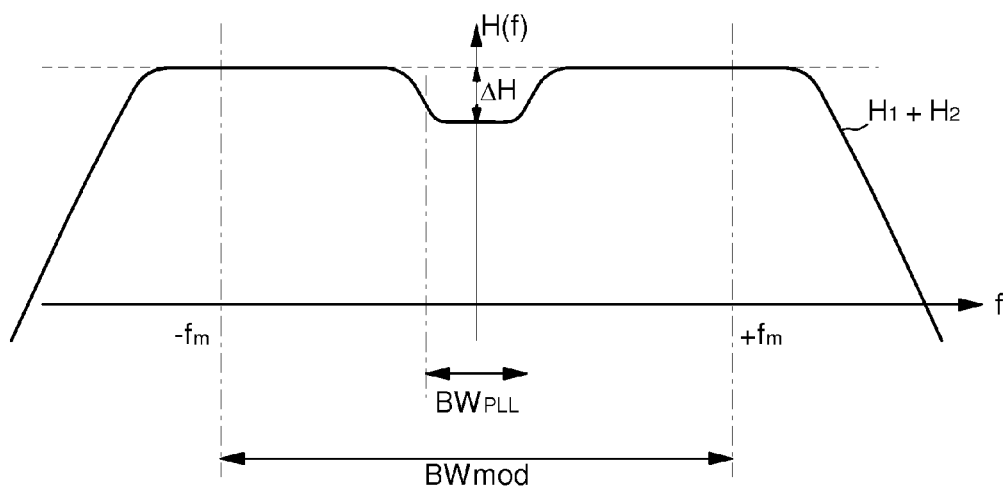

In order to represent the frequency deviation shift between the first phase lock loop and the high frequency access of an uncalibrated frequency synthesizer, reference is made to FIGS. 3a and 3b of the modulated data spectrum. These FIGS. 3a and 3b illustrate a first transfer function $H_1$ of the first phase lock loop and a second transfer function $H_2$ of the high frequency access. These transfer functions may be expressed for example in dB for the frequency deviation divided by the input signal. The amplitude of the two transfer functions must be equalised to calibrate the high frequency access and the first phase lock loop.

As can be seen in the hatched part, the first transfer function $H_1$ covers a low frequency modulation bandwidth ($BW_{PLL}$) where the first loop filter has a cut-off frequency of the order, for example, of 100 kHz. The second transfer function $H_2$ covers however a bandwidth that may go beyond the maximum modulation frequency defined by $f_m$ (1 MHz). The frequency synthesizer must be calibrated to have a modulation bandwidth ($Bw_{mod}$) of up to at least 1 MHz.

The maximum amplitude of the first transfer function $H_1$ is shown to be less than the maximum amplitude of the second transfer function $H_2$. An amplitude shift ΔH has to be corrected to obtain maximum amplitude across the entire constant modulation bandwidth $Bw_{mod}$. The voltage-controlled oscillator superposes the two transfer functions and carries out an addition of the two functions as shown in FIG. 3b.

Figure 4A:
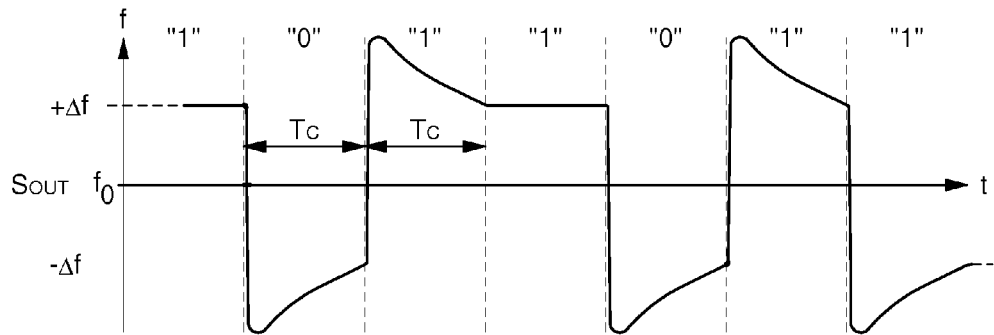
FIGS. 4a to 4c show graphs of the frequency modulation over time with signal distortions or delays appearing when the digital-analogue converter gain is not calibrated as shown in FIGS. 4a and 4b.
Figure 4B:
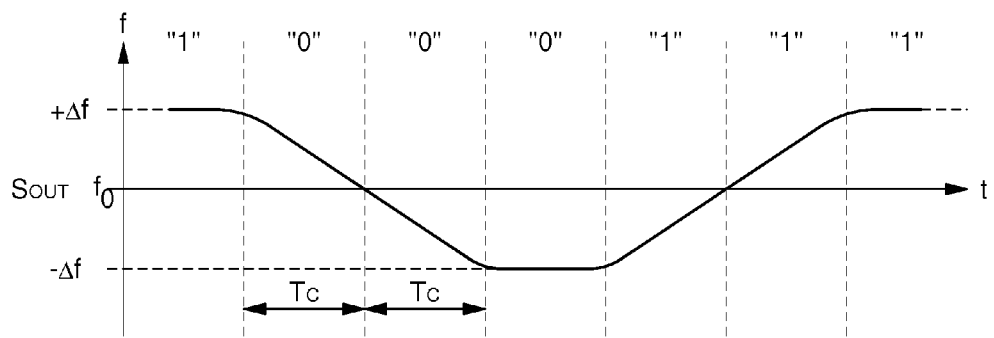
Figure 4C:
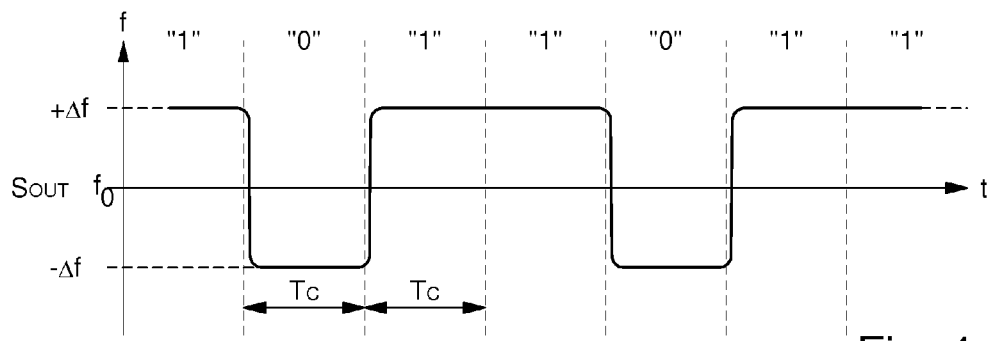

FIGS. 4a to 4c also show graphs of the frequency change over time relative to a selected carrier frequency, corresponding to data modulation in the output signal $S_{OUT}$ from the calibrated or uncalibrated frequency synthesizer. Data modulation is combined by the first phase lock loop and the high frequency access through the voltage controlled oscillator.

The "1" modulation state is defined in the output signal $S_{OUT}$ by adding the carrier frequency $f_0$ and the maximum modulation frequency deviation or shift Δf, which gives $f_0+Δf$. This "1" state can be given by a command word corresponding to the word Max to the digital-analogue converter and to the sigma-delta modulator.

The "0" modulation state is defined in output signal $S_{OUT}$ by subtracting the maximum modulation frequency deviation or shift Δf from the carrier frequency $f_0$, which gives $f_0−Δf$. This "0" state can be given by a command word corresponding to the word Min to the digital-analogue converter and to the sigma-delta modulator.

If the maximum amplitude of the second transfer function is greater than the maximum amplitude of the first transfer function as shown by FIGS. 3a and 3b, the high frequency transitions are accentuated relative to the low frequency transitions, as shown in FIG. 4a. There is thus too much gain in the digital-analogue converter. The maximum modulation state change frequency is defined as 1/Tc.

If, on the contrary, the maximum amplitude of the first phase lock loop is greater than that of the high frequency access, the state transitions are relatively slow as shown in FIG. 4b. There is thus not enough gain in the digital-analogue converter.

Once the digital-analogue converter gain has been calibrated as explained below with reference to FIGS. 2a to 2f, no distortion or switching delay is seen on the output signal across the entire modulation bandwidth as shown in FIG. 4c.

Of course, instead of FIGS. 4a to 4c, it would have been possible to show an eye-shaped diagram to show the uncalibrated state between the first loop and the high frequency access having the digital-analogue converter. If calibration were performed, it would show maximisation of the aperture of the eye, whereas non-calibration according to FIG. 4a or 4b would show a flattened eye shape along one axis of the diagram or the other.

With reference to FIGS. 2a to 2f, all the phases or steps of the self-calibration method of frequency synthesizer 1 are shown so as to equalise the spectrum amplitude level of the data modulated by digital-analogue converter 20 combined with the first low frequency phase lock loop. It should be noted that in each of these Figures, the various parts of the synthesizer, which are either at rest, or switched off, are shown in dotted lines. Thus, it is easier to understand the various phases for automatically calibrating the digital-analogue converter, up until the actual data modulation phase. Since all of the elements of frequency synthesizer 1 have already been described with reference to FIG. 1, they will not be explained in more detail.

Figure 2A:
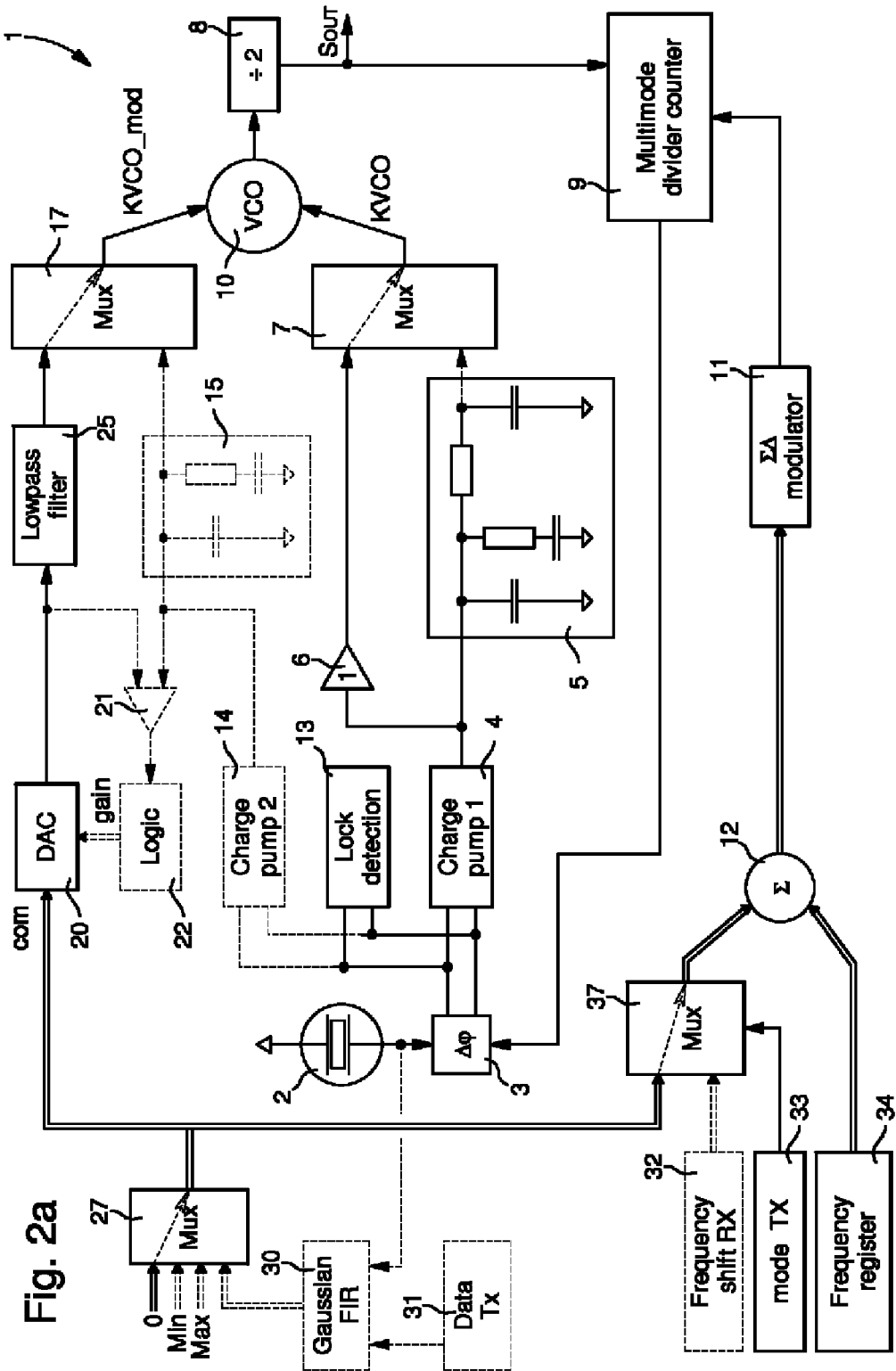

FIG. 2a shows the first phase or step of the self-calibration method for frequency synthesizer 1. In this first phase, the first phase lock loop has to be locked to the carrier frequency $f_0$ of a selected transmission channel.

Modulation multiplexer 27 is controlled so as to provide the binary command word 0 to represent carrier frequency $f_0$. This binary word 0 is supplied to digital-analogue converter 20, and to sigma-delta modulator 11 via multiplexer 37 and adder 12. The sigma-delta modulator also receives a frequency word originating from a frequency register 34 so as to be able to define the carrier frequency $f_0$ to be synthesized by the first phase lock loop.

In this first phase, the first charge pump 4 is switched on, whereas the second charge pump 14 is disconnected. Moreover, the first multiplexer 7 is controlled so that it connects the output of unitary voltage follower 6 to the first input of the main varactor of the voltage controlled oscillator. In this manner, the voltage stored in the first loop filter 5 is transmitted through voltage follower 6 to supply the first control voltage signal KVCO.

The second multiplexer 17 is controlled so that it connects the output of low-pass anti-aliasing filter 25 to the second modulation input of voltage controlled oscillator 10. Digital-analogue converter 20 thus supplies, through the low-pass filter and second multiplexer 17, the second control voltage signal whose level depends upon command word com, which, in this case, is the binary word 0. With this binary word 0, the level of the first basic output voltage of said converter does not change with a change in the gain of said converter.

By way of reminder, given the low cut-off frequency of the first phase lock loop, data frequency modulation for example at 1 or 2 Mbit/sec cannot be carried out by the first low frequency loop. This is also due to the fact that the reference frequency of the reference oscillator is between 16 and 26 MHz, and that it would be necessary to have a frequency of the order of 150 MHz to have a sufficiently fast loop. However, with a reference frequency of 150 MHz, it is not possible to reduce the electrical power consumption of the frequency synthesizer, whereas the reduction in consumption can be required.

If the cut-off frequency is set so low in this low frequency phase lock loop, this is mainly due to the noise generated by the sigma delta modulator, which has to be removed. However, with a cut-off frequency of the order of 100 kHz, the frequency synthesizer is approximately 10 times slower with the reference frequency at 16 MHz.

If one wishes to modulate frequency data at a frequency of 1 MHz on output signal $S_{OUT}$, the bandwidth has to be increased to 1 MHz after the first charge pump. This rapidity of the low frequency loop is not expected with a quartz oscillator with such a low frequency. For high frequency transitions, the high frequency access is thus also used for the voltage-controlled oscillator. The frequency difference for the frequency modulation is controlled by the first phase lock loop, where a small voltage deviation leads to a large frequency difference. The digital-analogue converter must thus be given a precise gain in order to equalise the spectrum amplitude level of the data modulated in the first loop and by the high frequency access, which is described below with reference in particular to FIGS. 2b to 2e.

Owing to the high frequency access via the digital-analogue converter, said converter will be able to inject high state transitions into the frequency modulation in combination with the more precise first low frequency loop. If there is a rapid passage of modulated data from one state to another, there is no distortion or delay observed in the output signal, by the digital-analogue converter if it is calibrated, which is desired.

Lock detection by a lock detector 13 can determine the instant at which the first phase lock loop is locked to the selected carrier frequency. Once detected, it can be passed to the second phase of the self-calibration method shown in FIG. 2b. However, as indicated previously, the lock time of this type of phase lock loop is generally known and it can be set or programmed to pass automatically from the first phase to the second phase of the self-calibration method.

Figure 2B:
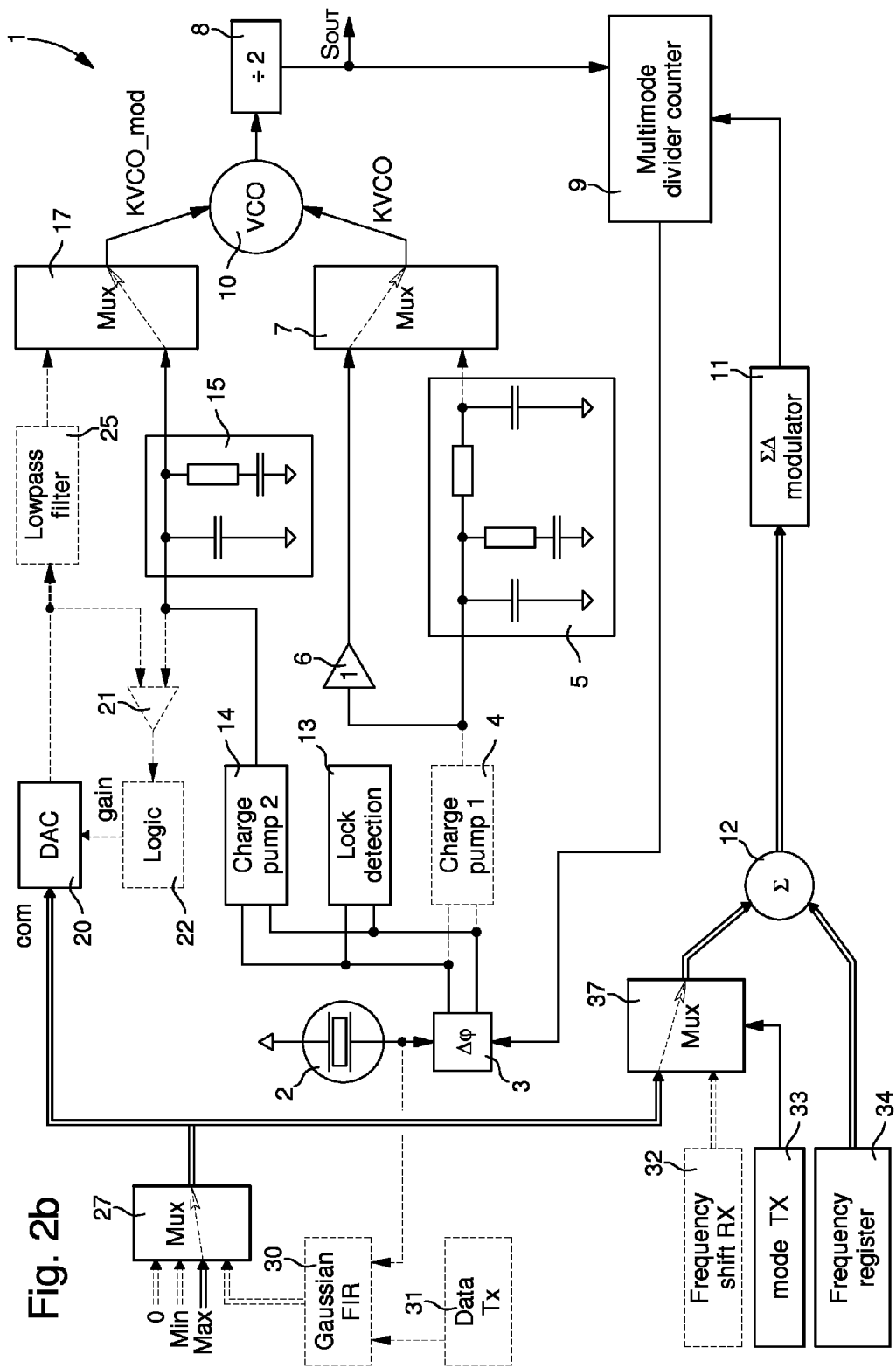

FIG. 2b shows the second phase or step of the self-calibration method of frequency synthesizer 1. In this second phase, the first charge pump 4 has to be disconnected in order to open the first phase lock loop, whereas the second charge pump 14 must be switched on to form a second phase lock loop with the second loop filter 15. In this second phase, comparator 21 and control logic 22 may be disconnected.

Care must also be taken, in the second phase of the method, not to disconnect first charge pump 4 abruptly, since a slight constant voltage error may still remain stored in first loop filter 5, which could lead to a subsequent calibration error for the digital-analogue converter. Consequently, it would be preferable to switch off the first charge pump gradually to avoid such errors. Approximately 60 cycles are needed to switch off the charge pump. So the bandwidth of the first phase lock loop is progressively and continuously reduced to 0 Hz to be in a quasi-stationary process.

In this second phase, the voltage stored in first loop filter 5 representing the selected carrier frequency, is transmitted via unitary voltage follower 6 and first multiplexer 7 as the first control voltage signal KVCO to the first input of the voltage controlled oscillator. This stored voltage represents the first control voltage signal KVCO. As indicated previously, the voltage follower can compensate for the current lost in the voltage-controlled oscillator in order to maintain a constant voltage across first loop filter 5.

The second multiplexer 17 is controlled to connect the second loop filter 15 to the second input of the voltage-controlled oscillator to close a second phase lock loop. This second phase lock loop must be locked in the second phase at a first synthesizer output frequency $f_0+\Delta f$, which must correspond to the addition of carrier frequency $f_0$ to a maximum modulation frequency deviation or shift $\Delta f$. The duration of the second loop locking operation may be of the order of 40 µs. To do this, modulation multiplexer 27 must be controlled to supply binary word Max to digital-analogue converter 20, which is left idle in this second phase, and especially to sigma delta modulator 11.

The voltage stored in the second loop filter 15 is supplied as the third control voltage signal to the second input of voltage-controlled oscillator 10, which is at a second voltage level. This voltage stored in second filter 15 will enable digital-analogue converter 20 to be automatically calibrated in the third phase.

Figure 2C:
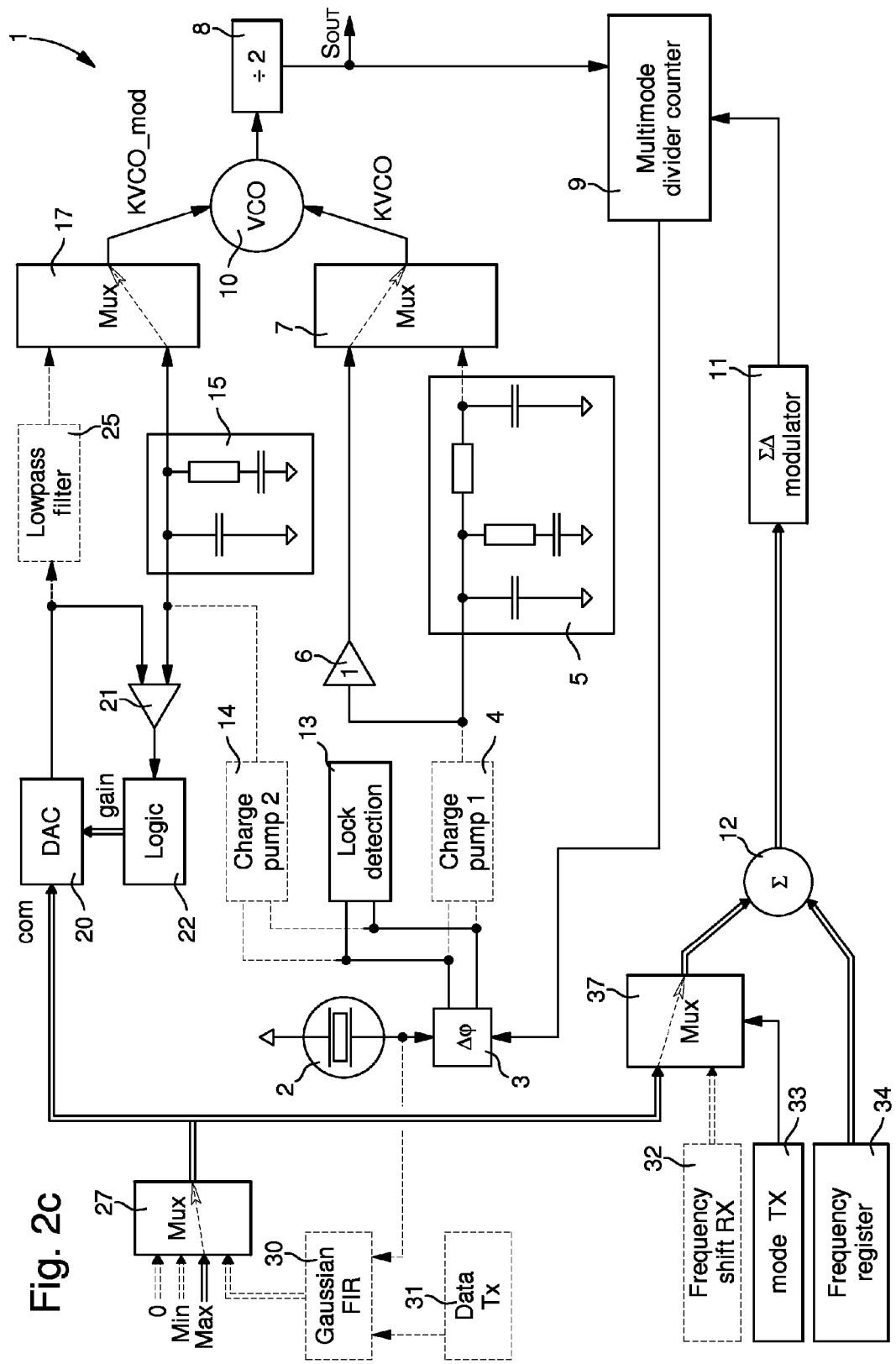

FIG. 2c shows the third phase or step of the self-calibration method of frequency synthesizer 1. In this third phase, first charge pump 4 remains disconnected, and second charge pump 14 is disconnected while maintaining a calibrating voltage stored in second loop filter 15. This calibrating voltage in the second loop filter remains approximately constant during the entire converter calibration step, even if a low leakage current may be observed in conjunction with the second input of voltage-controlled oscillator 10. The calibration period may be around 4 μs, which is 10 times less than the lock duration of the second loop.

In this third phase, comparator 21, control logic 22 and the digital-analogue converter are operating. Thus, the operating voltage comparator 21 compares the output voltage of converter 20, which has received binary word Max, to the voltage stored in the second loop filter 15. Voltage comparator 21 acts on control logic 22. The control logic supplies a binary word gain, which calibrates the converter gain until the output voltage of converter 20 is identical to the voltage stored in second loop filter 15 at a second voltage level.

During the digital-analogue converter calibrating operation, several voltage jumps are observed in the converter output, due to the change of binary word gain, which adapts the gain of said converter. There may be, for example, 5 measurements carried out via comparator 21 and control logic 22 before the discounted gain is obtained for converter 20. A dichotomy matching algorithm may be used for this.

The voltage deviation or shift between the first voltage level and the second voltage level at the output of digital-analogue converter 20 is representative of the maximum modulation frequency deviation or shift Δf to be calibrated relative to the first phase lock loop.

Figure 2D:
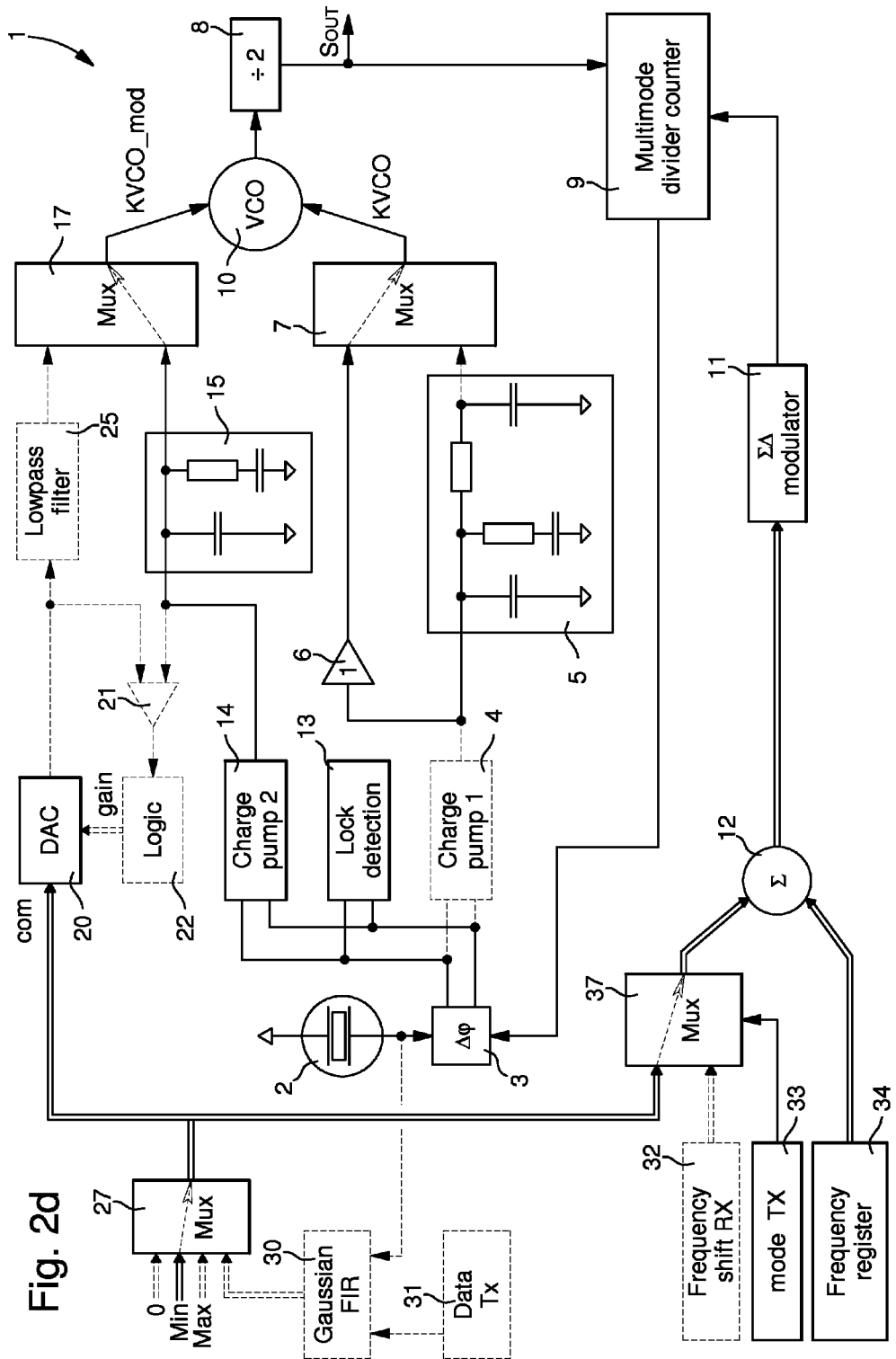

FIG. 2d shows the fourth phase or step of the self-calibration method for frequency synthesizer 1. This fourth phase is not strictly necessary for calibrating the frequency synthesizer. However, the fourth phase allows the frequency synthesizer to be better linearised. In this fourth phase, comparator 21 and control logic 22 may also be disconnected.

In the fourth phase, the first charge pump 4 remains disconnected leaving open the first phase lock loop, whereas the second charge pump 14 is switched on again to form, with second loop filter 15, the second phase lock loop. This second phase lock loop must be locked this time onto a second synthesizer output frequency $f_0-\Delta f$, which must correspond to the subtraction of the maximum modulation frequency deviation or shift Δf from carrier frequency $f_0$. To do this, modulation multiplexer 27 has to be controlled to supply binary word Min to digital-analogue converter 20, left idle in this fourth phase, and especially to sigma delta modulator 11. Thus the new voltage stored in second loop filter 15 is at a third voltage level this time.

FIG. 2e shows the fifth phase of the self-calibration method of frequency synthesizer 1. In this fifth phase, first charge pump 4 remains disconnected, and second charge pump 14 is again disconnected while maintaining a new calibrating voltage stored in second loop filter 15 at a third voltage level. This calibrating voltage in the second loop filter remains approximately constant during the entire converter calibration step, even if a low leakage current may be observed in conjunction with the second input of voltage-controlled oscillator 10.

In this fifth phase, comparator 21, control logic 22 and the digital-analogue converter are operating. Thus, voltage comparator 21 compares the voltage stored in the second loop filter 15 to the output voltage of digital-analogue converter 20, which has received binary word Min. The output of voltage comparator 21 acts on control logic 22 to adapt the gain of converter 20 to make the converter output voltage and the voltage stored in second loop filter 15 identical. This new matching of the converter gain can remove some non-linearity defects in the frequency synthesizer.

Figure 2F:
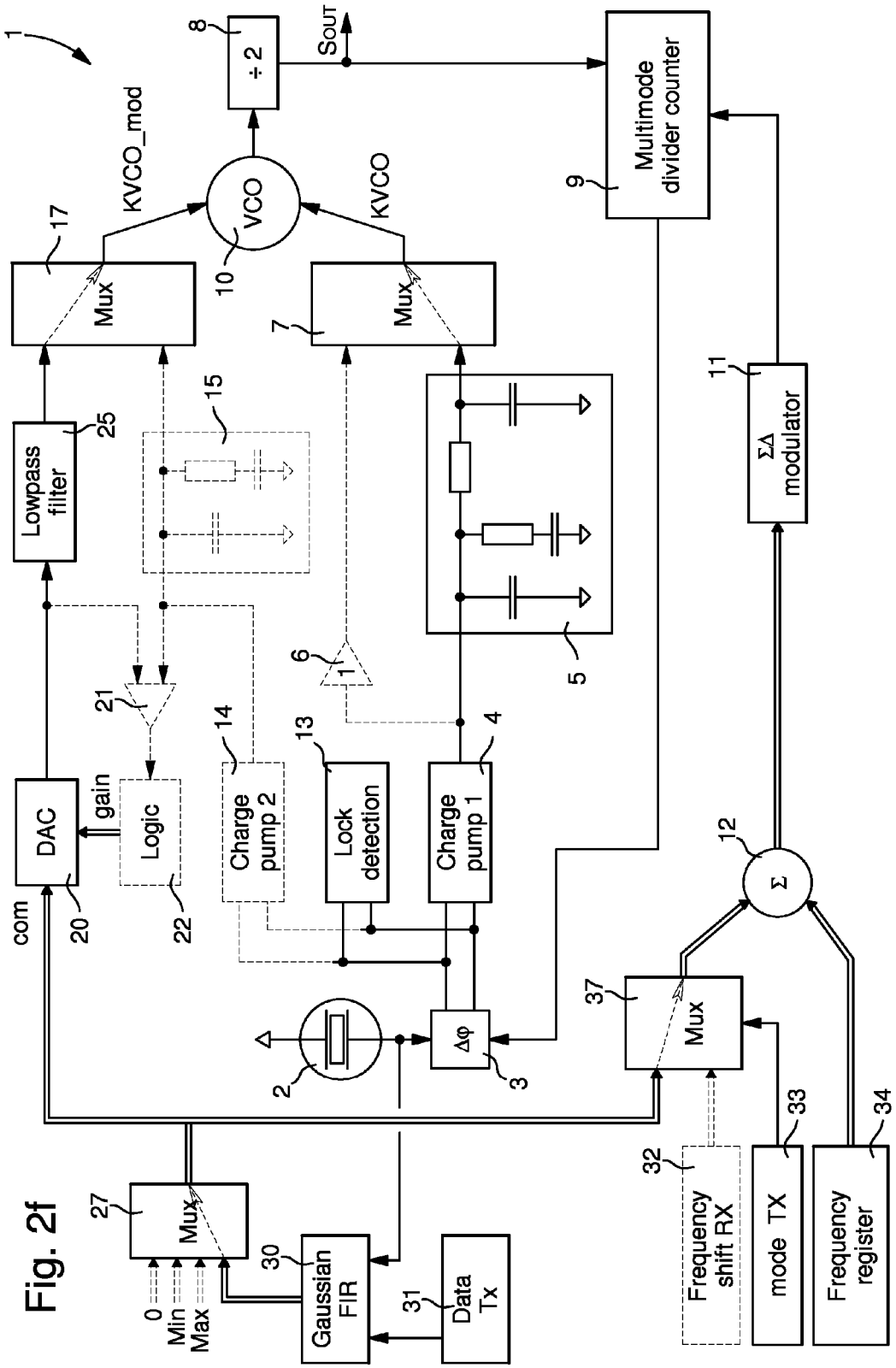

Finally, FIG. 2f shows a modulation phase at the end of the self-calibration method for frequency synthesizer 1 as soon as said frequency synthesizer has been calibrated.

In this modulation phase, the second charge pump 14 is disconnected, and the first charge pump 4 is switched on again. However, in this modulation phase, unitary voltage follower 6 must be disconnected. Consequently, the first multiplexer 7 is controlled so as to directly connect the first loop filter 5 to the first input of voltage-controlled oscillator 10.

Next to the high frequency access, the second multiplexer 17 is controlled so as to connect the anti-folding lowpass filter 25 directly to the second input of voltage-controlled oscillator 10. A second control voltage signal KVCO_mod can be provided by digital-analogue converter 20.

Modulation multiplexer 27 is controlled this time so as to supply at output a series of command words originating from the Gaussian type digital filter 30 on the basis of data Tx 31 to be modulated in the high frequency output signal $S_{OUT}$. This series of command words is provided both to the converter 20 and to sigma delta modulator 11 via multiplexer 37 and adder 12. Since the gain of converter 20 is calibrated, the combination of the first phase lock loop with the high frequency access enables a high frequency signal to be obtained without any distortion or data modulation switching delay.

From the description that has just been given, several variants of the synthesizer self-calibration method and the synthesizer for implementing said method could be devised by those skilled in the art without departing from the scope of the invention defined by the claims. In the connecting means, the charge pumps could be replaced by switches, but the charge pump structure is relatively simpler and quicker than a switch structure. The sensitivity at the two inputs of the voltage-controlled oscillator could be altered. There could be two or more digital-analogue converters to be calibrated and connected to a second input of the voltage-controlled oscillator. The reference oscillator frequency could be altered or adapted. Finally, the voltage-controlled oscillator could generate at output two high frequency signals in phase opposition.

The invention claimed is:

1. A self-calibration method for a frequency synthesizer that can perform two point frequency modulation for data transmission, the self-calibration method including the steps of:
 (a) providing a frequency synthesizer, wherein the frequency synthesizer includes:
  (1) a first low-pass phase lock loop in which there are placed a reference oscillator, a phase comparator connected to the reference oscillator, a first low-pass loop filter, a voltage-controlled oscillator, which is connected via a first input of a first varactor with a first sensitivity in the first low-pass phase lock loop for receiving a first control voltage signal via the first low-pass loop filter, a multimode counter-divider controlled by a modulator to frequency divide a high frequency output signal on the basis of a high frequency signal produced by the voltage-controlled oscillator, so as to supply a divided signal for comparison with a reference signal of the reference oscillator in the phase comparator; and
  (2) a high frequency access in which is placed a digital-analogue converter for supplying a second control voltage signal to a second input of a second varactor with a second sensitivity of the voltage-controlled oscillator for high frequency data modulation, the second sensitivity being several orders of magnitude less than the first sensitivity, and the second varactor being independent of the first varactor, (b) in a first phase, locking the first low-pass phase lock loop onto a transmission channel with a determined carrier frequency at an output of the synthesizer, and supplying a first command word to the converter in the high frequency access corresponding to the determined carrier frequency for generating a second control voltage signal for the voltage-controlled oscillator, at a first basic voltage level, (c) in a second phase, opening the first low-pass phase lock loop, while maintaining, via the first low-pass loop filter, a first control voltage signal corresponding to the determined carrier frequency for a first input of the voltage-controlled oscillator, locking a second low-pass phase lock loop, which includes a second low-pass loop filter in the high frequency access connected between the phase comparator of the first loop and a second input of the voltage-controlled oscillator, at a first output frequency equal to the carrier frequency added to a maximum modulation frequency shift, and supplying the digital-analogue converter with a second command word that represents the first output frequency, (d) in a third phase, opening the second low-pass phase lock loop while maintaining, via the second low-pass loop filter, a second control voltage signal corresponding to the first output frequency for the second input of the voltage-controlled oscillator, and comparing the converter output voltage with the voltage stored in the second low-pass loop filter to calibrate the converter gain automatically so that the converter output voltage is equivalent to the voltage stored in the second low-pass loop filter at a second voltage level, whose shift with the first basic voltage level defines the maximum equalised modulation frequency shift, and (e) in a modulation phase, closing the first low-pass phase lock loop and connecting the converter output to the second input of the voltage-controlled oscillator for two point data modulation by the voltage-controlled oscillator using a series of command words in time supplied to the calibrated digital-analogue converter and to the modulator of the first low-pass phase lock loop.

2. The self-calibration method according to claim 1, wherein, between the step (d) and the step (e), the self-calibration method further includes the steps of:

in a fourth phase, closing and locking the second phase lock loop onto a second output frequency which is the result of subtracting the maximum modulation frequency deviation from the carrier frequency, and supplying a third command word to the digital-analogue converter to represent the second output frequency, and in a fifth phase, opening the second phase lock loop while maintaining, via the second loop filter, a second control voltage signal corresponding to the second output frequency for the second input of the voltage-controlled oscillator, and comparing the converter output voltage to the voltage stored in the second loop filter, to calibrate the converter gain automatically so that the converter output voltage is equivalent to the voltage stored in the second filter at a third voltage level, whose shift with the first basic voltage level defines the maximum equalised modulation frequency shift.

3. The self-calibration method according to claim 1, wherein the first phase lock loop includes a first charge pump between the phase comparator and the first loop filter, and the second phase lock loop includes a second charge pump between the phase comparator and the second loop filter, wherein the first phase lock loop is opened or closed via the first charge pump, wherein the second phase lock loop is opened or closed via the second charge pump, and wherein during an opening phase, the first charge pump and/or the second charge pump are gradually disconnected, particularly after 60 cycles, where the bandwidth of the first and/or second phase lock loops is gradually and continually reduced to 0 Hz, to maintain a constant voltage in the first loop filter and/or the second loop filter at a well defined level.

4. The self-calibration method according to claim 1, wherein in the first to fifth phases, the first control voltage signal is supplied by a unitary voltage follower connected at input to the first loop filter to compensate for the leakage current in the first varactor of the voltage-controlled oscillator.

5. The self-calibration method according to claim 4, wherein a first multiplexer is arranged between the first input of the voltage-controlled oscillator and the output of the first loop filter and the unitary voltage follower, wherein in the first to fifth phases, the first multiplexer is controlled to connect the voltage follower to the first input of the voltage-controlled oscillator, whereas in the modulation phase, the first multiplexer is controlled to connect the first loop filter to the first input of the voltage-controlled oscillator.

6. The self-calibration method according to claim 1, wherein a second multiplexer is arranged between the second input of the voltage-controlled oscillator and an output of the second loop filter and a low-pass anti-aliasing filter connected to the digital-analogue converter, wherein in the first phase and the modulation phase, the second multiplexer is controlled to connect the second input of the voltage-controlled oscillator to the low-pass anti-aliasing filter for direct supplying the second control voltage signal originating from the digital-analogue converter output, and wherein in the second to fifth phases, the second multiplexer is controlled to connect the second input of the voltage-controlled oscillator to the second loop filter to receive a third control voltage signal.

7. The self-calibration method according to claim 1, wherein the digital-analogue converter calibration steps are performed as soon as the synthesizer is switched on or in a synthesizer operating mode at the end of each programmed operating period, and wherein a control logic, connected at output to a comparator, adapts the converter gain by a binary word, such as a 5-bit word.

8. A frequency synthesizer for implementing the self-calibration method according to claim 1, the frequency synthesizer being able to perform two point frequency modulation for data transmission, the frequency synthesizer including:

a first low-pass phase lock loop in which there are placed a reference oscillator, a phase comparator connected to the reference oscillator, a first low-pass loop filter connected to the phase comparator via a first charge pump, a voltage-controlled oscillator, which is connected via a first input of a first varactor with a first sensitivity in the first low-pass phase lock loop for receiving a first control voltage signal via the first low-pass loop filter, a multi-mode counter-divider controlled by a modulator to frequency divide a high frequency output signal on the basis of a high frequency signal produced by the voltage-controlled oscillator, so as to supply a divided signal for comparison with a reference signal of the reference oscillator in the phase comparator;

a high frequency access in which is placed a digital-analogue converter for supplying a second control voltage signal to a second input of a second varactor with a second sensitivity of the voltage-controlled oscillator for high frequency data modulation, the second sensitivity being several orders of magnitude less than the first sensitivity, and the second varactor being independent of the first varactor; and a second low-pass loop filter in the high frequency access that can be connected via a second charge pump between the phase comparator of the first loop and ache second input of the voltage-controlled oscillator so as to form a second low-pass phase lock loop for a digital-analogue converter calibration operation, and in that the high frequency access includes a voltage comparator for comparing an output voltage, which comes directly from the digital-analogue converter, to a voltage stored in the second low-pass loop filter, after locking the second low-pass phase lock loop onto a determined output frequency, so as to automatically adjust the digital-analogue converter gain.

9. The frequency synthesizer according to claim 8, further including a control logic in the high frequency access for receiving an output signal from the voltage comparator so as to supply a binary word for adjusting the digital-analogue converter gain, where the binary word can be a 5-bit word.

10. The frequency synthesizer according to claim 8, further including a unitary voltage follower in the first phase lock loop, one input of which is connected to one input of the first loop filter, and one output of the voltage follower can be connected to a first input of the voltage-controlled oscillator, said unitary voltage follower being provided to compensate for any current leakage in the voltage-controlled oscillator varactor.

11. The frequency synthesizer according to claim 10, further including a first multiplexer arranged between the first input of the voltage-controlled oscillator and the output of the first loop filter and the unitary voltage follower, the first multiplexer being controlled to connect the voltage follower or the first loop filter to the first input of the voltage-controlled oscillator.

12. The frequency synthesizer according to claim 8, further including a second multiplexer arranged between the second input of the voltage-controlled oscillator, the second sensitivity of which is of the order of 100 times less than the first sensitivity of the first input, in particular around 4 MHz/V, and one output of the second loop filter and a low-pass anti-aliasing filter connected to the digital-analogue converter, the second multiplexer being controlled to connect the low-pass anti-aliasing filter or the second loop filter to the second input of the voltage-controlled oscillator.

13. The frequency synthesizer according to claim 8, wherein the first phase lock loop includes a differential structure formed of a first differential charge pump, a first differential loop filter and a differential voltage follower for connecting either the output of the differential voltage follower, or the output of the first differential loop filter to a first differential input of the voltage-controlled oscillator.

14. The frequency synthesizer according to claim 8, wherein the second phase lock loop includes a differential structure formed of a second differential charge pump and a second differential loop filter, wherein the output of the second differential loop filter is for connection to a second differential input of the voltage-controlled oscillator when the second phase lock loop is closed.

15. The frequency synthesizer according to claim 8, further including a modulation multiplexer for supplying at least one modulation frequency command word to the digital-analogue converter and to a sigma delta modulator for controlling the multimode counter-divider of the first or second phase lock loop, and wherein the digital-analogue converter is formed of switched current sources and an active poly-resistance load OTA.

\* \* \* \* \*